United States Patent
Neumann

(10) Patent No.: US 10,688,926 B2
(45) Date of Patent: Jun. 23, 2020

(54) COMPACT LIGHT-EMITTING DIODE ARRANGEMENT

(71) Applicant: Inova Semiconductors GmbH, München (DE)

(72) Inventor: Roland Neumann, München (DE)

(73) Assignee: Inova Semiconductors GmbH, München (DE)

( * ) Notice: Subject to any disclaimer, the term of this patent is extended or adjusted under 35 U.S.C. 154(b) by 0 days.

(21) Appl. No.: 16/467,894

(22) PCT Filed: Nov. 16, 2017

(86) PCT No.: PCT/EP2017/001349
§ 371 (c)(1),
(2) Date: Jun. 7, 2019

(87) PCT Pub. No.: WO2018/103880
PCT Pub. Date: Jun. 14, 2018

(65) Prior Publication Data
US 2020/0070720 A1    Mar. 5, 2020

(30) Foreign Application Priority Data
Dec. 8, 2016  (DE) .................. 10 2016 014 649

(51) Int. Cl.
*H05B 33/00*    (2006.01)
*B60Q 9/00*    (2006.01)
(Continued)

(52) U.S. Cl.
CPC .............. *B60Q 9/00* (2013.01); *B60R 1/1207* (2013.01); *F21S 43/14* (2018.01); *H05B 45/10* (2020.01);
(Continued)

(58) Field of Classification Search
CPC .. B60R 1/088; B60R 1/04; B60R 1/12; B60R 1/025; B60R 1/06; B60R 2001/1223;
(Continued)

(56) References Cited

U.S. PATENT DOCUMENTS

2009/0021955 A1   1/2009  Kuang et al.
2011/0108860 A1   5/2011  Eissler et al.
(Continued)

FOREIGN PATENT DOCUMENTS

DE   102011004746 A1   8/2012
WO   WO-2008025625 A1   3/2008
(Continued)

OTHER PUBLICATIONS

"International Application No. PCT/EP2017/001349, International Preliminary Report on Patentability dated Nov. 26, 2018", (dated Nov. 26, 2018), 16 pgs.

(Continued)

*Primary Examiner* — Monica C King
(74) *Attorney, Agent, or Firm* — Schwegman Lundberg & Woessner, P.A.

(57) ABSTRACT

The present invention is directed to a compact light-emitting diode arrangement which can be used generically but, by reason of the compact design, is advantageous in particular for use in a vehicle. For instance, the compact light-emitting diode arrangement can be used e.g. as interior lighting in a car. The present invention is also directed to a vehicle component having the compact light-emitting diode arrangement. Furthermore, a method for producing the compact light-emitting diode arrangement is proposed as is a computer program product including control commands which implement the proposed method.

14 Claims, 5 Drawing Sheets

Figure 1:
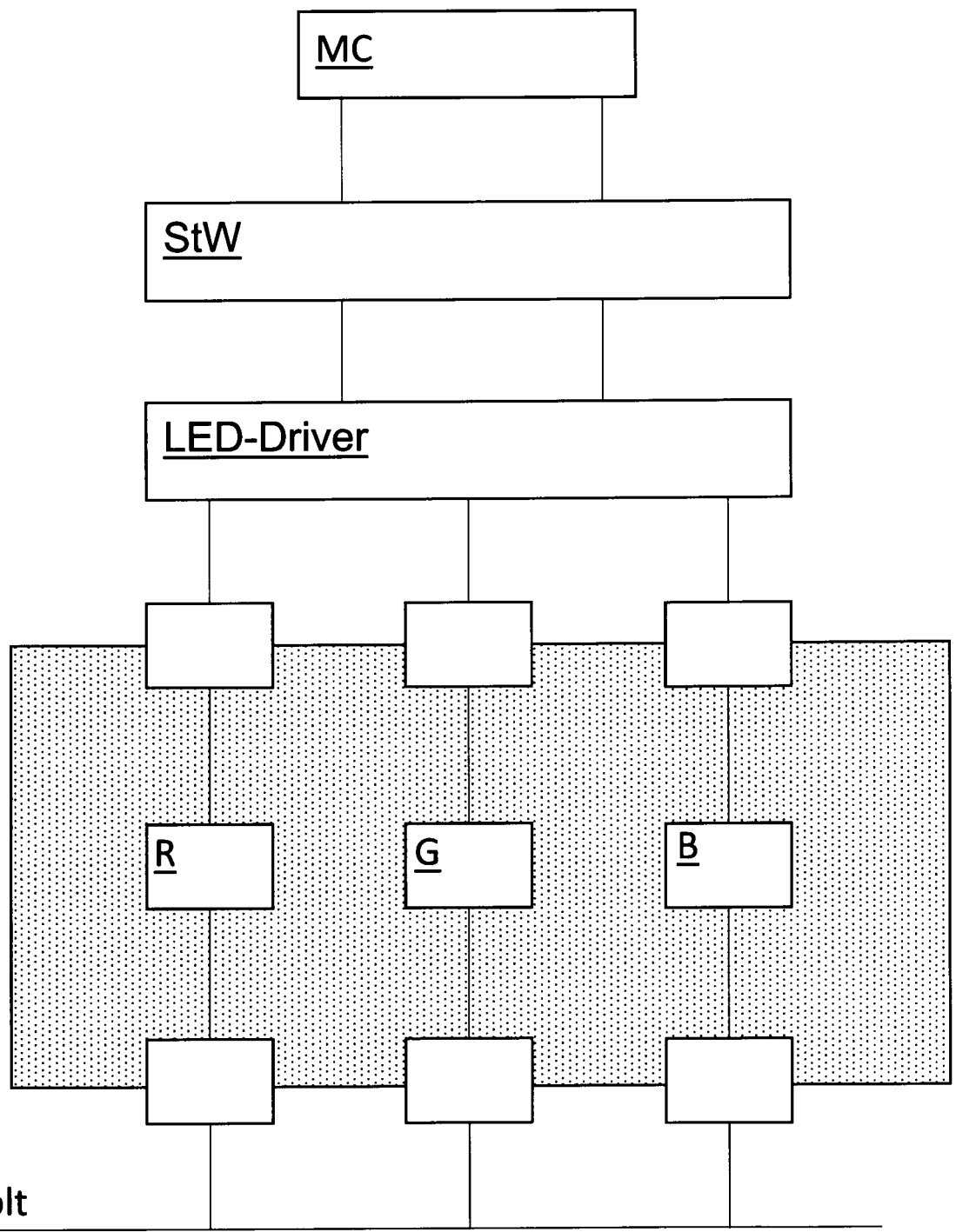

(51) Int. Cl.
    *F21S 43/14*    (2018.01)
    *B60R 1/12*    (2006.01)
    *H05B 45/10*    (2020.01)
    *F21W 103/30*    (2018.01)
    *F21Y 113/17*    (2016.01)
    *F21Y 115/10*    (2016.01)

(52) U.S. Cl.
    CPC ...... *F21W 2103/30* (2018.01); *F21Y 2113/17* (2016.08); *F21Y 2115/10* (2016.08)

(58) Field of Classification Search
    CPC ......... B60R 1/00; B60R 1/0602; B60R 1/062; B60R 1/082; B60R 1/083; B60R 1/1207; B60R 2001/1215; B60R 2001/123; B60R 2001/1246; B60R 2001/1253; B60R 2001/1284; B60R 2300/105; B60R 2300/207; B60R 2300/8026; B60R 2300/804; B60R 2300/806; B60R 2300/8066; G02F 1/161; G02F 1/1533; G02F 1/157; G02F 1/153; G02F 1/155; G02F 1/163; G02F 2203/09
See application file for complete search history.

(56) References Cited

U.S. PATENT DOCUMENTS

2012/0229882 A1\* 9/2012 Fish, Jr. .................. B60R 1/025
                                                                             359/267
2015/0009702 A1    1/2015  Fiederling et al.

FOREIGN PATENT DOCUMENTS

WO    WO-2009140947 A2    11/2009
WO    WO-2018103880 A1    6/2018

OTHER PUBLICATIONS

"International Application No. PCT/EP2017/001349, International Search Report and Written Opinion dated Mar. 7, 2018", (dated Mar. 7, 2018), 14 pgs.

\* cited by examiner

COMPACT LIGHT-EMITTING DIODE ARRANGEMENT

PRIORITY CLAIM TO RELATED APPLICATIONS

This application is a U.S. national stage filing under 35 U.S.C. § 371 from International Application No. PCT/EP2017/001349, filed on 16 Nov. 2017, and published as WO2018/103880 on 14 Jun. 2018, which claims the benefit under 35 U.S.C. 119 to German Application No. 10 2016 014 649.4, filed on 8 Dec. 2016, the benefit of priority of each of which is claimed herein, and which applications and publication are hereby incorporated herein by reference in their entirety.

The present invention is directed to a compact light-emitting diode arrangement which can be used generically but, by reason of the compact design, is advantageous in particular for use in a vehicle. For instance, the compact light-emitting diode arrangement can be used e.g. as interior lighting in a car. The present invention is also directed to a vehicle component having the compact light-emitting diode arrangement. Furthermore, a method for producing the compact light-emitting diode arrangement is proposed as is a computer program product including control commands which implement the proposed method.

WO 2008/025625 shows a light module with at least one light emitting diode arranged on a substrate, wherein the Substrate is formed by silicium and the light emitting diode is arranged as a light emitting chip.

WO 2009/140947 A2 shows an opto-electronic module comprising a carrier substrate layer with different circuits being pre-constructed in or on the carrier substrate layer at wafer level stage in front end processes.

DE 10 2011 004 746 A1 shows a semiconductor light apparatus with a housing, at least one heat sink arranged within the housing, wherein the heat sink is thermally connected with at least one semiconductor light source and an active cooling unit arranged inside the housing.

According to known methods, light-emitting diodes are used in many usage scenarios, particularly in the automotive industry. For example, it is known to connect light-emitting diodes in series such that they create the optical illusion of a continuous band. For this purpose, it is known to activate light-emitting diodes e.g. by means of pulse width modulation such that the brightness is dimmed. Therefore, it is possible to connect a plurality of light-emitting diodes linearly in series and thus to generate in optical terms a circumferential band. For this purpose, it is possible to activate the individual light-emitting diodes such that, by interaction thereof, they generate an optically moving fluorescent strip. For this purpose, individual light-emitting diodes, which for the time being are switched off, are dimmed up to full illuminating power and are then dimmed down. Therefore, by smart activation of the plurality of light-emitting diodes the optical illusion of a wave is produced within a band of light-emitting diodes.

However, specifically the automotive industry is faced with the technical problem that light-emitting diodes also provide safety-relevant functions. For instance, light-emitting diodes are known which function as warning lights or else also simply provide merely an ambient light. In both usage scenarios, the requirements placed upon the light-emitting diodes used are high because they must operate reliably and in particular are to have colour fidelity. In this case, there is thus the technical obstacle of designing a light-emitting diode in general in a compact manner whilst still ensuring reliability and colour fidelity in this case.

According to the prior art, it is particularly disadvantageous that certain designs of light-emitting diodes along with a corresponding activation are not suitable for some usage scenarios. For example, in the automotive industry particular requirements are placed upon the dimensions of the light-emitting diodes along with the control mechanism. In this case, it is necessary to consider that typically light-emitting diodes are constructed not individually but often in a large number of units. Disadvantageous dimensioning thus has multiple negative effects. However, it is often thus not possible to mount a specific number of light-emitting diodes along with the control mechanism on a specified surface. Furthermore, with unfavourable dimensioning it is disadvantageous that a desired aesthetic effect cannot be achieved because the dimensions of conventional light-emitting diode arrangements are not suitable for a specific pattern.

Therefore, it is an object of the present invention to propose a compact light-emitting diode arrangement which renders it possible to provide light-emitting diodes along with the control mechanism with particularly small dimensioning. In this case, it is additionally necessary to ensure that, in spite of the compact design, the corresponding light-emitting diodes operate reliably and with colour fidelity. It is also an object of the present invention to propose a vehicle component, comprising a compact light-emitting diode arrangement. It is also an object of the present invention to propose a method for producing the compact light-emitting diode arrangement, as well as a computer program product including control commands which implement the proposed method.

The object is achieved by a compact light-emitting diode arrangement for use in a vehicle according to the features of claim 1. Further embodiments are described in the dependent claims.

Accordingly, a compact light-emitting diode arrangement for use in a vehicle is proposed, having a plurality of light-emitting diodes, wherein the light-emitting diodes along with a control mechanism, which is arranged to set the brightness intensity of the light-emitting diodes in each case, are arranged in one piece in a common housing.

Whereas the proposed compact light-emitting diode arrangement can be used in a large number of usage scenarios, it is particularly suitable for use in a vehicle, preferably in a vehicle interior. This is the case because the integration of the light-emitting diodes with the control mechanism results in small dimensioning of the light-emitting diode unit and therefore a particularly compact light-emitting diode arrangement is provided.

The use in a vehicle is focussed on the fact that e.g. a vehicle interior always has a certain temperature prevailing therein which moves within predictable limits. For instance, individual vehicle parts are typically not heated excessively because e.g. only car parts having a large surface area are heated when exposed to solar radiation such that they are encumbered with considerable heat development. Therefore, the proposed light-emitting diode arrangement is suitable in particular for use in a vehicle interior which typically does not fall below a specific temperature limit and furthermore also does not exceed a certain upper temperature limit. Therefore, requirements other than those relating to conventional light-emitting diodes which are subjected to greater temperature fluctuations are applicable in this case. In particular, a vehicle has a characteristic use of light-emitting diodes such that e.g. a light-emitting diode operation of longer than 10 hours is rather untypical. In this case, it has been particularly surprising to discover that even with temperature development in the light-emitting diodes per se the design of a light-emitting diode arrangement can still be compact.

For instance, in comparison with other usage scenarios, the temperature fluctuations are thus restricted substantially to a starting procedure of the vehicle, during which a very low or very high temperature can still prevail in the vehicle interior. However, as soon as the interior lighting is activated, the driver will regulate the temperature to a level comfortable for him and thus set a moderate, typically uniform temperature. Therefore, a vehicle interior is generally an air-conditioned area which still requires compensation of brightness intensity of the light-emitting diodes by reason of solar radiation or heating. These requirements are thus different to those which have to be taken into consideration e.g. for light-emitting diode activation in the outside environment. This likewise represents merely one aspect of the invention.

Therefore, in accordance with the invention it has surprisingly been recognised that the use of light-emitting diodes in a vehicle gives rise to specific technical requirements but also provides options. For instance, the technical obstacle that a compact design is not possible by reason of heat development as per conventional methods has been overcome in accordance with the invention. However, in this case the automotive industry in particular benefits from the advantage that light-emitting diodes are often not in a state of continuous operation but are activated selectively. If e.g. a light-emitting diode provides a warning, then this is activated merely over a course of a few seconds. This likewise represents merely one aspect of the invention. In this case, it is also possible that a warning is given by virtue of the fact that a light-emitting diode changes from a first colour to a second colour. For example, a light-emitting diode briefly illuminated on a rear-view mirror can signal to a driver that he should pay attention to a vehicle travelling behind or travelling slightly offset from him. For this purpose, it is possible to implement e.g. a lane change assistant which signals to the driver by means of a light-emitting diode in an exterior rear-view mirror that an offset vehicle is travelling in a blind spot. For instance, this light can merely provide a signal when the vehicle is located in this blind spot and thus a change of lane is precluded. If a vehicle moves out of the blind spot, then the light-emitting diode also switches off. Furthermore, it is possible to provide a warning by an increase in the brightness of a light-emitting diode already in operation. In this case, a prevailing colour setting can be maintained.

Therefore, by reason of the use in a vehicle a novel, compact light-emitting diode arrangement can be provided which is suitable for usage scenarios which provide merely a brief operation of the light-emitting diode arrangement. This can be e.g. a usage scenario which provides illumination of the light-emitting diodes of less than one day.

A plurality of light-emitting diodes can be present e.g. as three or four light-emitting diodes which in each case provide red, green or blue light and optionally additionally provide a white light. However, a plurality of light-emitting diodes can also be provided such that these light-emitting diode groups are connected in series such that a continuous band or a flat light-emitting diode arrangement is produced. For instance, it is particularly advantageous to arrange the plurality of light-emitting diodes in such a manner as to provide the impression in optical terms of a single lighting means of a certain geometry. In particular, an arrangement which provides a rectangle or a band is suitable in this case.

In this case, the light-emitting diodes are activated by means of a control mechanism which sets the respective brightness intensity. In particular, the control mechanism is also suitable for setting a mixing ratio of the individual light-emitting diodes in relation to their emission such that a desired colour shade or a certain lighting intensity is provided. In this case, it is possible for the control mechanism to communicate with further components which are arranged outside the light-emitting diode arrangement. However, the control mechanism effects direct communication with the individual light-emitting diodes and activates them in the desired manner. For example, a superordinate control unit can also be provided which, in turn, communicates with the individual control mechanisms of different lighting means. For example, a continuous wave of a light-emitting diode band can be generated such that an external control unit activates the different control mechanisms in each case of a light-emitting diode arrangement. The superordinate control unit can be a microcontroller or generally a controller.

The control mechanism is arranged to set the brightness intensity of the light-emitting diodes in each case such that the light-emitting diodes can be set individually in relation to their lighting intensity. Therefore, it is also possible to simultaneously activate three or four light-emitting diodes such that a specific mixing ratio is provided. However, ageing processes can cause individual light-emitting diodes to lose brightness intensity over the course of a life cycle. In this case, it may even be possible to replace an individual light-emitting diode or a light-emitting diode group. A light-emitting diode group can be combined e.g. as three or four light-emitting diodes which provide red, green, blue and optionally white light. If such a light-emitting diode group is being replaced, it is particularly advantageous to also replace the control mechanism at the same time in order to avoid complex fault diagnostics. In this case, it is particularly advantageous in accordance with the invention that the control mechanism along with the light-emitting diodes are arranged in one piece in a common housing.

In this case, "in one piece" means that the individual light-emitting diodes, i.e. the plurality of light-emitting diodes and the control mechanism are connected to one another such that they cannot be separated in a non-destructive manner. This does not necessarily imply that the plurality of light-emitting diodes and the control mechanism per se are configured in one piece by means of direct contact, but on the contrary the housing provides a replaceable unit which comprises the control mechanism and the plurality of light-emitting diodes. Again, this produces the technical effect that the entirety of the light-emitting diodes and control mechanism can be replaced in maintenance units.

In general, it is possible that, in the case of a light-emitting diode arrangement, the assembly undergoes a physical impairment in addition to natural ageing processes. For example, it is possible for the light-emitting diode arrangement to undergo a deformation by reason of an undesired force effect. In this case, it would be possible according to conventional arrangements that the light-emitting diodes per se are damaged, the control mechanism is damaged or that a conductive track has been damaged. Therefore, according to the prior art it is particularly disadvantageous that the light-emitting diode arrangement has to be analysed in relation to the underlying fault. In accordance with the invention, this is overcome by virtue of the fact that the control mechanism and the plurality of light-emitting diodes are arranged in one piece in a housing. Therefore, a compact light-emitting diode unit is provided which can be replaced as a whole in a simple manner. In particular, the advantageous effect is achieved that the conductive tracks are typically non-destructive because the length thereof is merely minimal. In the case of conventional arrangements, the light-emitting diodes and the control mechanism are arranged spatially separated from one another, for which reason longer conductive tracks are required at this location. It is only by the proposed arrangement that this disadvantage is overcome and the arrangement provided is less prone to faults.

The housing can be preferably a housing which is generally provided for light-emitting diodes. In particular, a synthetic material housing which encloses the light-emitting diodes is suitable in this case. Therefore, in accordance with the invention it is particularly advantageous that the control mechanism and the light-emitting diodes are arranged in a common housing which is to be provided in any case for the light-emitting diodes. This does not prevent further carrier elements from being provided or else also does not prevent e.g. the light-emitting diodes from being encased with a further transparent synthetic material. In particular, a chip housing, which is also designated as a package, is suitable as a housing.

In particular, it is advantageous, in a single working step, to insert the plurality of light-emitting diodes and the control mechanism into a housing or to arrange the housing around the devices. In this case, the person skilled in the art knows existing methods which are performed in order to encase light-emitting diodes and then also the control mechanism e.g. in a form-fitting manner. In particular, it is possible to cast individual components. Therefore, a one-piece assembly is to be provided which is arranged in a common housing. In this case, care should be taken that corresponding communications lines or a power supply from outside the light-emitting diode arrangement are guaranteed.

According to one aspect of the present invention, the control mechanism along with a communications unit and a light-emitting diode driver are installed in the housing. This has the advantage that all of the components which are required for directly activating the light-emitting diodes can be arranged within the common housing. Typically, a microcontroller implements a specific logic which is performed by the light-emitting diode driver such that the light-emitting diodes are activated with a specific voltage or current strength. Therefore, the individual light-emitting diodes are adapted in relation to their brightness intensity. In particular, it is advantageous in this case that both components, namely the control mechanism and the light-emitting diode driver, are arranged in a protective manner within the housing. This provides a robust yet compact design.

According to a further aspect of the present invention, the light-emitting diodes are activated exclusively by the driver. The LED driver, control mechanism and communication are located on the chip. This has the advantage that merely one direct connection has to be provided between the LED driver and the light-emitting diodes. According to one aspect of the present invention, this implies that no further components which communicate with the light-emitting diodes are to be arranged within the housing. Therefore, it is possible to implement merely a small number of external data lines in the proposed arrangement. Again, this ensures that the controlling components which act directly upon the light-emitting diodes can be arranged in the common housing in a single working step. However, this does not exclude the provision of further, superordinate control devices which, however, communicate with the respective control mechanism. These superordinate units can control e.g. a lighting behaviour of the individual light-emitting diode groups such that a specific optical effect, e.g. a wave, is achieved.

In the present case, the LED driver and the communications interface are not listed. They can be provided such that the communications interface communicates with a microcontroller arranged externally of the housing. However, this communications interface is configured in a passive manner and reacts merely to instructions from the microcontroller as an external, superordinate unit. The LED driver receives merely the signals of the control mechanism. Therefore, within a housing the control mechanism is the only component which actively computes and communicates in a logical manner with the other components. For example, the control mechanism receives from the communications unit a command to dim the LED and for this purpose calculates the pulse width modulation in the LED driver to be suitably activated. Therefore, a microcontroller is explicitly not provided in the housing.

According to a further aspect of the present invention, measuring units are provided in the housing. This has the advantage that specific sensors can be arranged which measure a brightness intensity of the light-emitting diodes. In this case, it is possible to detect absolute values of the individual brightnesses of the light-emitting diodes. Corresponding processing steps can then be performed e.g. by the microcontroller which is located in the same housing as the light-emitting diodes. Therefore, it is particularly advantageous that the measuring units can likewise be integrated into the housing in a technically simple manner and are also protected. Therefore, an efficient production method is accomplished.

According to a further aspect of the present invention, the plurality of light-emitting diodes and the control mechanism are provided exclusively as active functional components in the housing. This has the advantage that, as a result, it is ensured that the housing is actually also to be provided such that no further components of an on-board system are to be arranged in the housing. For instance, the person skilled in the art can also recognise a multiplicity of housings, wherein, in the present case, in particular a housing is to be provided in the manner in which it protects e.g. light-emitting diodes according to conventional methods. If such a light-emitting diode assembly is then installed into a terminal, it could be incorrectly assumed that just a housing of the terminal protects the housing in accordance with the invention. However, according to the proposed technical teaching, the housing is a housing which typically comprises only the control mechanism and the individual light-emitting diodes. In this case, further passive components can be provided. For example, conductive tracks or bond wires can be provided. Further passive components can be configured as a communications interface or LED driver.

According to a further aspect of the present invention, the housing is provided as a light-emitting diode housing. This has the advantage that no housing of an external terminal or a separate housing has to be provided. Therefore, a housing is provided which combines merely the light-emitting diodes and the control mechanism in one piece such that a replaceable component is produced. This ensures that the proposed housing is generally restricted to one design, as used typically also in relation to light-emitting diodes. In particular, this can be a transparent or semi-transparent housing. In this case, transparent or semi-transparent as well as partially opaque surfaces can be provided within the housing. Therefore, it is possible within the housing to provide window regions, through which it is possible to observe the brightness intensity of the light-emitting diode from outside the housing. In this case, it is possible for further light barriers to be provided within the proposed housing. This is the case because UV radiation can prevent smooth functioning of the control mechanism. For this purpose, it is possible to provide a lacquer layer within the housing such that components, in particular the control mechanism, are protected within the housing in particular against the emission of the light-emitting diodes. If measuring units or measuring sensors are arranged within the housing, it is necessary to ensure that they function without fault so that they can measure or detect parameters of the light-emitting diodes. In this case, the person skilled in the art is aware of possible ways of providing transparent regions within the housing, e.g. using a transparent synthetic material.

According to a further aspect of the present invention, the plurality of light-emitting diodes are provided as a red light-emitting diode, a green light-emitting diode, a blue light-emitting diode and an optional white light-emitting diode. This has the advantage that existing light-emitting diode groups can be re-used and in particular that these light-emitting diodes are particularly suitable for the proposed arrangement. Furthermore, it is particularly advantageous that a white light-emitting diode is to be provided merely as an option in order to react to a specific usage scenario. Therefore, it is proposed in accordance with the invention to operate as small a number as possible of light-emitting diodes in the proposed arrangement because they produce heat development. Therefore, a small number of light-emitting diodes has the advantage that disadvantageous heat development is avoided where possible. Therefore, it is ensured in accordance with the invention that in spite of the compact design an ageing process of light-emitting diodes is not accelerated. Since light-emitting diodes generally undergo an ageing process which is to be attributed in particular to heat development, it is thus particularly advantageous to provide merely three light-emitting diodes, i.e. a red, a green and a blue light-emitting diode. However, it is possible in general to install any number of light-emitting diodes.

The object is also achieved by a vehicle component comprising a compact light-emitting diode arrangement, having a plurality of light-emitting diodes, wherein the light-emitting diodes along with a control mechanism, which is arranged to set the brightness intensity of the light-emitting diodes in each case, are arranged in one piece in a common housing.

This is advantageous because specific requirements apply in particular in a vehicle interior but also in general in a vehicle. As already described in the introduction, corresponding light-emitting diodes can provide a warning which, in turn, can be particularly safety-critical. For instance, specific requirements are placed upon light-emitting diodes in a vehicle because they have to be compact, reliable and have colour fidelity. Therefore, it has been surprisingly established that the proposed light-emitting diode arrangement is particularly suitable for vehicle components. The present invention is thus also directed to vehicle components per se which benefit from the fact that a compact light-emitting diode arrangement is provided. This produces in particular the technical effect that within the vehicle component more light-emitting diode units can be arranged in a confined space than is possible according to the prior art.

The present invention thus provides an advantageous light-emitting diode arrangement which can also be adapted more easily in terms of its geometry. Since the control mechanism is now no longer arranged externally of the light-emitting diodes, almost any geometry can now be produced. In particular, external conductive tracks are avoided which, according to the prior art, connect the light-emitting diodes to the control mechanism. Since these conductive tracks are no longer required or are installed merely to a very small extent within the housing, a particularly robust structure is produced which has advantageous effects in particular in a vehicle. Surprisingly, it has also been established that the proposed arrangement is particularly suitable in spite of the compact design within a vehicle because in this case light-emitting diodes are typically not switched on in a continuous operation.

For instance, vehicle components can be provided which have a particularly long service life and still have a multiplicity of light-emitting diodes. The shorter switch-on time serves to overcome the technical obstacle that the light-emitting diodes emit heat during operation and thus could impair the control mechanism. Whereas in the case of known methods the control mechanism is arranged outside the housing of the light-emitting diodes, in accordance with the invention it is particularly advantageous to arrange the control mechanism within the housing in spite of the technical obstacle of heat development. Therefore, even a longer operation of the light-emitting diodes of several hours can be accepted because in this case the heat development is not expected to cause any impairment.

In particular, the proposed arrangement is also advantageous because a housing can also be provided in an efficient manner for the control mechanism which is protected against moisture by said housing. The same applies to conductive tracks which now are no longer arranged externally but on the contrary can likewise be arranged in the housing because both the control mechanism and the light-emitting diodes are installed in the same housing. Therefore, vehicle components are provided which are also protected in a particular manner without in this case causing considerable technical outlay. In this case, the particular protection afforded by the common housing is used not only in the case of installed vehicle components but also the common housing already ensures that the mounted components are protected and can be kept available over a longer time period.

According to a further aspect of the present invention, the vehicle component is provided as a trim strip, an interior rear-view mirror, an exterior rear-view mirror, a warning light, an interior light and/or a vehicle light. This has the advantage that e.g. a trim strip produces the technical effect that a multiplicity of light-emitting diodes can be installed in a specified space by reason of the compact design. This has an effect in particular in the vehicle interior which is always confined. In particular, the arrangement in accordance with the invention produces particularly aesthetic effects by reason of the multiplicity of light-emitting diodes to be installed. In relation to an interior rear-view mirror or a warning light, the advantage is that, again, a multiplicity of light-emitting diodes can be installed without in this case impairing colour fidelity or reliability. In the case of such components, the operating time of the light-emitting diodes is relatively short, for which reason low heat development and an even slower ageing process are to be expected. Therefore, e.g. warning lights maintain the desired colour over a long time period and are not encumbered by unreliability. Since the ageing process is slow, the brightness intensity is also influenced only to a slight extent, for which reason the proposed vehicle component can even also be used as an interior light.

According to a further aspect of the present invention, a plurality of light-emitting diode arrangements are connected in series. This has the advantage that any geometry can be provided such that a multiplicity of light-emitting diode assemblies can be activated collectively and a desired image is thus displayed. This highlights the technical advantage of the compact design particularly because the savings in terms of space of the proposed light-emitting diode arrangements add up and thus have a particular effect.

The object is also achieved by a method for producing a compact light-emitting diode arrangement for use in a vehicle, comprising providing a plurality of light-emitting diodes, wherein a control mechanism is provided which is arranged to set the brightness intensity of the light-emitting diodes in each case, and the provided plurality of light-emitting diodes and the provided control mechanism are arranged in one piece in a common housing.

The proposed method is thus suitable for producing an assembly as already described. In particular, the method is suitable for producing a vehicle component.

According to a further aspect of the present invention, the light-emitting diode arrangement is introduced into a vehicle component. This has the advantage that an existing vehicle component can be inventively upgraded such that the compact light-emitting diode arrangement is used therein. Therefore, even already produced vehicle components can be upgraded in a particularly advantageous manner. This renders it possible to incorporate the proposed method into an existing production sequence.

According to a further aspect of the present invention, the vehicle component is designed as a trim strip, an interior rear-view mirror, an exterior rear-view mirror, a warning light, an interior light and/or a vehicle light. This has the advantage that a multiplicity of existing vehicle components can be re-used and can be inventively upgraded.

According to a further aspect of the present invention, the provided plurality of light-emitting diodes and the provided control mechanism are arranged in the housing in one working step. This has the advantage that the light-emitting diodes and the control mechanism can be integrated into the housing e.g. at the same time, for which reason a small amount of technical outlay is required to carry out the proposed invention. Therefore, compared with the prior art the production processes are substantially simplified and on the whole fewer working steps are to be provided.

The object is also achieved by a computer program product including control commands which implement the proposed method. Therefore, the method can be provided as software or in terms of hardware technology.

In accordance with the invention, it is particularly advantageous that the method is suitable for producing the proposed arrangement and thus structural features of the arrangement can also be replicated accordingly as method steps. Demonstrated structural features are achieved by at least one method step in the production. Furthermore, the individual method steps provide structural features which find expression in the proposed arrangement. In this case, the computer program product is to suitably provide control commands which implement the corresponding method steps.

Figure 2:
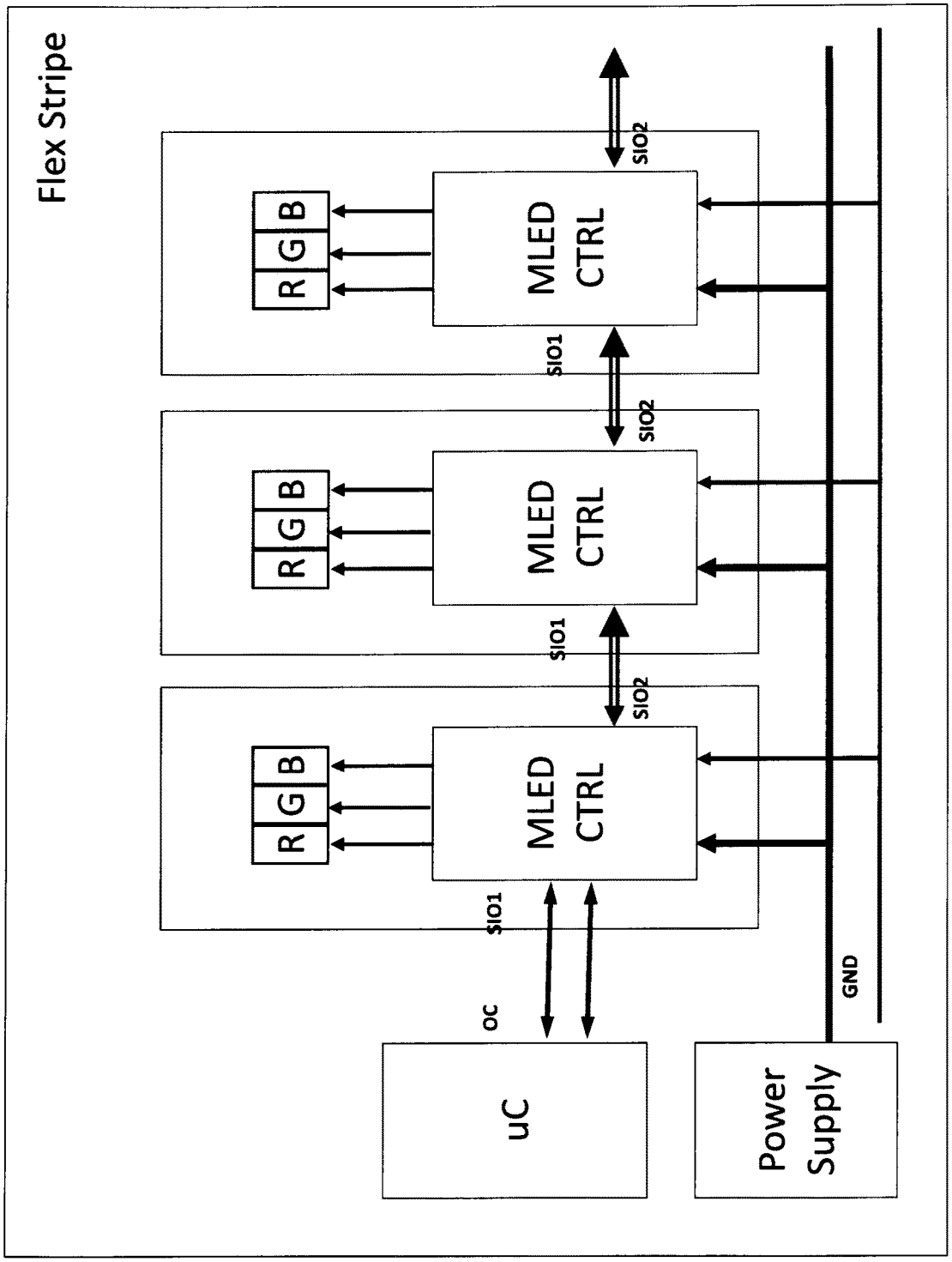
Figure 3:
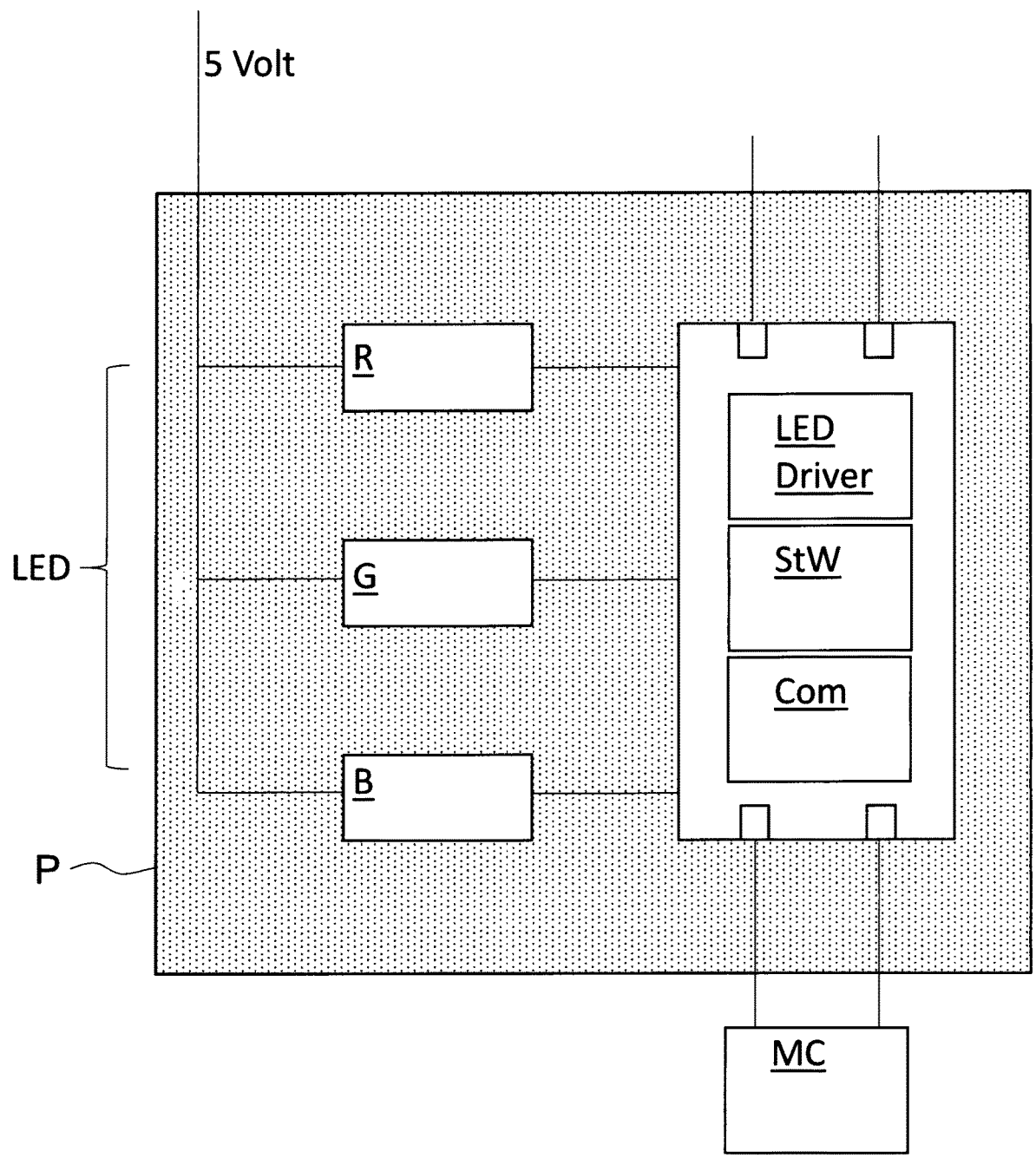
Figure 4:
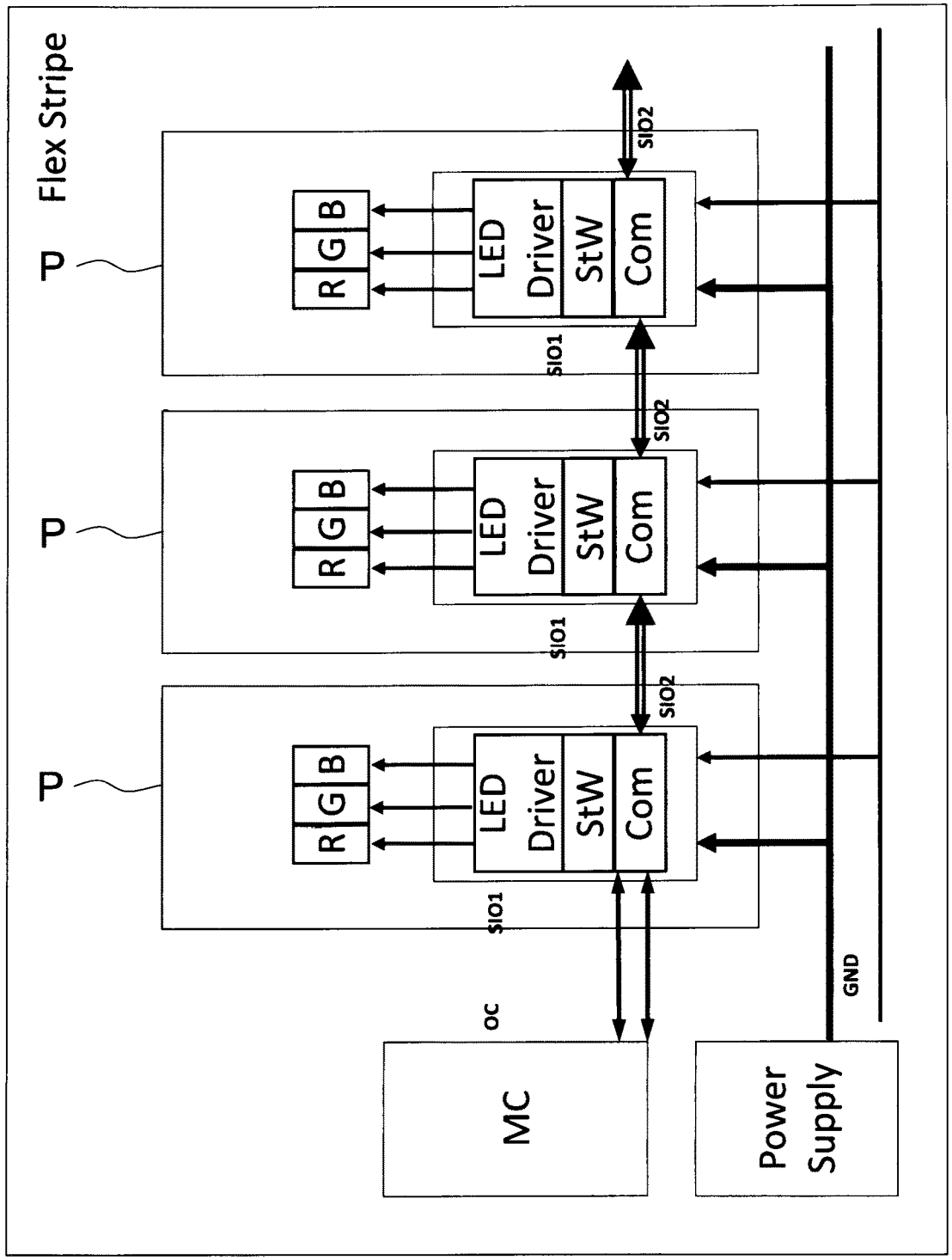
Figure 5:
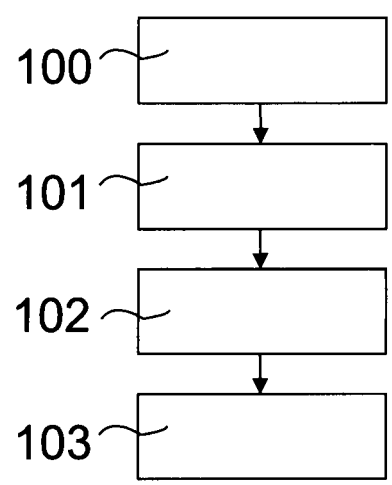

Further advantageous embodiments will be explained in greater detail with reference to the attached figures. In the figures:

FIG. 1: shows a block diagram illustrating how a light-emitting diode arrangement is to be adapted in accordance with the invention;

FIG. 2: shows a block diagram illustrating how a light-emitting diode arrangement is to be adapted in accordance with the invention;

FIG. 3: shows a block diagram of a compact light-emitting diode arrangement according to one aspect of the present invention;

FIG. 4: shows a block diagram of a compact light-emitting diode arrangement comprising series-connected light-emitting diode apparatuses according to one aspect of the present invention; and FIG. 5: shows a schematic flow diagram of a method for producing a compact light-emitting diode arrangement according to a further aspect of the present invention.

FIG. 1 shows at the top a microcontroller MC which communicates with an LED driver. The LED driver is connected to the light-emitting diodes via corresponding pins or bonds. In this case, it can be seen that outside the housing, which in the present case is illustrated at the bottom, a plurality of conductive tracks are required which connect the LED driver and the housing and the microcontroller MC and the control mechanism StW to the LED driver. This is particularly prone to faults and is complex to produce. In this case, there is also the technical obstacle of integrating corresponding external assemblies into the common housing because heat development in the light-emitting diodes is disadvantageous in this case. However, in accordance with the invention it has been recognised that when the corresponding light-emitting diode arrangement is being used in a vehicle, heat development which damages such a design is not expected to occur. In particular, it is difficult in technical terms to arrange corresponding assemblies within the housing because they are very fine structures, for which reason the person skilled in the art always arranged corresponding components externally of the housing.

FIG. 2 shows control units in the form of controllers. The control units can be so-called multi-LED controllers. In the present FIG. 2, this is indicated as MLED CTRL. In general, a microcontroller MC or controller are defined as being semiconductor chips which contain a processor and also peripheral functions at the same time. The control mechanism StW, also the program control mechanism or instruction control mechanism, is a functional unit of a processor which controls the sequence of command processing, i.e. loads, optionally decodes and interprets commands. Therefore, controllers and control mechanisms are different in terms of their functional scope. In this case, the MLED controller assumes the task of activating the LEDs. Since the individual MLED controllers cannot have a control mechanism, they can be activated at all times only via the microcontroller. It is also known e.g. to provide a main controller. However, these components are often not formed in one piece. Moreover, known controllers often cannot set the brightness intensity but instead only the mixing ratio of the LEDs in to provide a colour value. Moreover, housings are known in which the LEDs are not arranged in the housing but instead protrude therefrom. However, this is at variance with the present invention which provides a compact design. Since FIG. 2 is a top view, a design is described here which provides for the light-emitting diodes to protrude from the housing.

FIG. 3 shows the LED housing P in accordance with the invention which provides both the control mechanism on the right-hand side and also the individual light-emitting diodes R, G and B on the left-hand side. Therefore, it is ensured that a single common housing P is to be provided which protects both the light-emitting diodes and also the control mechanism. The housing is a housing P which has viewing windows such that the lighting intensity of the light-emitting diodes can be observed from outside the housing P. In particular, a chip housing, which is also designated as a package P, is suitable as a housing.

In this case, it is possible to configure the control mechanism StW and the LED driver in one piece or else also in the present view to arrange the control mechanism StW at the top and the LED driver at the bottom. Furthermore, it is also possible to arrange the driver between the light-emitting diodes and the control mechanism StW. Again, this provides the advantage that any geometries can be produced and therefore a multiplicity of usage scenarios are possible. Therefore, a particularly compact design is provided without any significant ageing processes occurring in this case.

FIG. 4 shows light-emitting diodes connected in series and having a separate LED driver, a separate control mechanism and a separate communications interface Com. In this case, the control mechanism has been relocated into the housing P and in contrast to known arrangements the control mechanism StW, which is arranged to set the brightness intensity of the light-emitting diodes LED in each case, is arranged in one piece in the common housing P. Thus, in accordance with the invention it is possible that a microcontroller MC outputs a command and in this case activates merely a selection of light-emitting diodes. Therefore, a plurality of light-emitting diodes can be activated at the same time. For example, the first and third light-emitting diodes are activated. The communications interface Com receives the command in each case. The respective control mechanism recognises whether its identifier has been activated and relays the signal to the LED driver. For example, the first control mechanism recognises that it has been activated, decodes a brightness value and activates the LED driver such that it sets the intensity. This likewise represents merely one aspect of the invention.

In this case, in contrast to known methods, it is possible that the control mechanism can calculate exclusively an activation signal for the LED driver. Therefore, the control mechanism can perform pulse width modulation and vary the amplitude. Therefore, the colour scheme of the light-emitting diode LED can be set by means of the mixing ratio, the brightness intensity can be set by means of pulse width modulation and the brightness intensity can be set by means of an amplitude of the signal of the pulse width modulation. Therefore, no peripheral functions can be provided, as performed by a controller or a microcontroller. Therefore, a particularly efficient design is produced which can be provided in an efficient manner.

The LED drivers thus communicate solely and directly with the light-emitting diode units RGB without a controller being required for this purpose. This provides the advantage that the components can be produced separately and in a specialised manner. For example, standardised LED drivers can be re-used, whereas specialised control mechanisms StW can be installed. In the case of light-emitting diodes comprising a separate LED driver, a separate control mechanism and a separate communications interface, these components can be provided as dedicated, separate components and the respective functional scope can be set in an individualised manner. Only when these components are assembled can they be arranged in one piece and thus in a compact manner.

FIG. 5 shows a schematic flow diagram of a method for producing a compact light-emitting diode arrangement for use in a vehicle, comprising providing 100 a plurality of light-emitting diodes, wherein a control mechanism is provided 101 which is arranged to set the brightness intensity of the light-emitting diodes in each case, and the provided plurality of light-emitting diodes and the provided control mechanism are arranged 102 in one piece in a common housing. In this case, the person skilled in the art is able to recognise that the proposed method steps can be performed iteratively and/or in another sequence. For example, the control mechanism can be provided before the light-emitting diodes are provided. Furthermore, a plurality of light-emitting diodes can also be provided which along with the control mechanism are arranged in a common housing.

The present case does not show a computer program product including control commands which implement the proposed method. In general, the method can be provided as software or in terms of hardware technology.

The invention claimed is:

1. A compact light-emitting diode arrangement for use in a vehicle, comprising a plurality of light-emitting diodes, wherein the light-emitting diodes along with a control mechanism, which is arranged to set the brightness intensity of the light-emitting diodes individually, are arranged in one piece in a common chip housing and transparent or semi-transparent as well as partially opaque surfaces are provided within the chip housing to provide window regions, through which the brightness intensity of the light-emitting diode is observable from outside the chip housing, and a lacquer layer is arranged such that the control mechanism is protected within the housing against the emission of the light-emitting diodes.

2. The light-emitting diode arrangement as claimed in claim 1, wherein the control mechanism along with a communications unit and a light-emitting diode driver are installed in the chip housing.

3. The light-emitting diode arrangement as claimed in claim 1, wherein the light-emitting diodes are activated exclusively by the control mechanism.

4. The light-emitting diode arrangement as claimed in claim 1, wherein measuring units are provided in the chip housing.

5. The light-emitting diode arrangement as claimed in claim 1, wherein the plurality of light-emitting diodes and the control mechanism are provided exclusively as active functional components in the chip housing.

6. The light-emitting diode arrangement as claimed in claim 1, wherein the plurality of light-emitting diodes are provided as a red light-emitting diode, a green light-emitting diode, a blue light-emitting diode and an optional white light-emitting diode.

7. A vehicle component comprising a compact light-emitting diode arrangement, comprising a plurality of light-emitting diodes, wherein the light-emitting diodes along with a control mechanism, which is arranged to set the brightness intensity of the light-emitting diodes individually, are arranged in one piece in a common chip housing and transparent or semi-transparent as well as partially opaque surfaces are provided within the chip housing to provide window regions, through which the brightness intensity of the light-emitting diode is observable from outside the chip housing, and a lacquer layer is arranged such that the control mechanism is protected within the housing against the emission of the light-emitting diodes.

8. The vehicle component as claimed in claim 7, wherein the vehicle component is provided as a trim strip, an interior rear-view mirror, an exterior rear-view mirror, a warning light, an interior light and/or a vehicle light.

9. The vehicle component as claimed in claim 7, wherein a plurality of light-emitting diode arrangements are connected in series.

10. A method for producing a compact light-emitting diode arrangement for use in a vehicle, comprising providing a plurality of light-emitting diodes, wherein a control mechanism is provided which is arranged to set the brightness intensity of the light-emitting diodes individually, and the provided plurality of light-emitting diodes and the provided control mechanism are arranged in one piece in a common chip housing and transparent or semi-transparent as well as partially opaque surfaces are provided within the chip housing to provide window regions, through which the brightness intensity of the light-emitting diode is observable from outside the chip housing, and a lacquer layer is arranged such that the control mechanism is protected within the housing against the emission of the light-emitting diodes.

11. The method as claimed in claim 10, wherein the light-emitting diode arrangement is introduced into a vehicle component.

12. The method as claimed in claim 11 wherein the vehicle component is designed as a trim strip, an interior rear-view mirror, an exterior rear-view mirror, a warning light, an interior light and/or a vehicle light.

13. The method as claimed in claim 10, wherein the step of arranging the provided plurality of light-emitting diodes and the provided control mechanism in the chip housing is performed in one working step.

14. A computer program product including control commands which implement the method as claimed in claim 10.

* * * * *